United States Patent
Draney et al.

(10) Patent No.: US 6,882,036 B2
(45) Date of Patent: Apr. 19, 2005

(54) APPARATUSES FOR FORMING THIN MICROELECTRONIC DIES

(75) Inventors: Nathan R. Draney, Boise, ID (US); Michael E. Connell, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/835,369

(22) Filed: Apr. 29, 2004

(65) Prior Publication Data

US 2004/0203188 A1 Oct. 14, 2004

Related U.S. Application Data

(62) Division of application No. 10/348,635, filed on Jan. 21, 2003, now Pat. No. 6,762,074.

(51) Int. Cl.[7] .............................................. H01L 23/02
(52) U.S. Cl. ....................... 257/678; 257/749; 257/753; 257/783
(58) Field of Search .............................. 257/678, 749, 257/753, 783; 438/106–107, 113, 118

(56) References Cited

U.S. PATENT DOCUMENTS

| | | | |
|---|---|---|---|
| 5,851,845 A | 12/1998 | Wood et al. | |
| 5,933,713 A | 8/1999 | Farnworth | |
| 5,946,553 A | 8/1999 | Wood et al. | |
| 6,004,867 A | 12/1999 | Kim et al. | |
| 6,008,070 A | 12/1999 | Farnworth | |
| 6,020,624 A | 2/2000 | Wood et al. | |
| 6,072,236 A | 6/2000 | Akram et al. | |
| 6,124,634 A | 9/2000 | Akram et al. | |
| 6,175,162 B1 | 1/2001 | Kao et al. | |
| 6,184,465 B1 | 2/2001 | Corisis | |
| 6,187,615 B1 | 2/2001 | Kim et al. | |
| 6,228,687 B1 | 5/2001 | Akram et al. | |
| 6,235,552 B1 | 5/2001 | Kwon et al. | |
| 6,326,697 B1 | 12/2001 | Farnworth | |
| 6,326,698 B1 | 12/2001 | Akram | |
| 6,407,381 B1 | 6/2002 | Glenn et al. | |
| 6,503,780 B1 | 1/2003 | Glenn et al. | |
| 6,683,416 B1 * | 1/2004 | Oohata et al. | 315/169.3 |
| 2002/0081816 A1 * | 6/2002 | Spooner et al. | 438/413 |

* cited by examiner

*Primary Examiner*—Thien F Tran
(74) *Attorney, Agent, or Firm*—Perkins Coie LLP

(57) ABSTRACT

Methods and apparatuses for forming thin microelectronic dies. A method in accordance with one embodiment of the invention includes releasably attaching a microelectronic substrate to a support member with an attachment device. The microelectronic substrate can have a first surface, a second surface facing opposite from the first surface, and a first thickness between the first and second surfaces. The attachment device can have a releasable bond with the microelectronic substrate, wherein the bond has a bond strength that is reduced upon exposure to at least one energy. The support member can be at least partially transmissive to the at least one energy. The method can further include reducing a thickness of the microelectronic substrate and directing a quantity of the at least one energy through the support member to the attachment device to reduce the strength of the bond between the attachment device and the microelectronic substrate. At least a portion of the microelectronic substrate can then be separated from the support member. The support member can accordingly provide releasable support to the microelectronic substrate while the thickness of the microelectronic substrate is reduced.

12 Claims, 2 Drawing Sheets

APPARATUSES FOR FORMING THIN MICROELECTRONIC DIES

CROSS-REFERENCE TO RELATED APPLICATION

This application is a divisional application of U.S. patent application Ser. No. 10/348,635, entitled "METHOD AND APPARATUS FOR FORMING THIN MICROELECTRONIC DIES," filed Jan. 21, 2003 now U.S. Pat. No. 6,762,074, which is herein incorporated by reference in its entirety.

TECHNICAL FIELD

The present disclosure relates to methods and apparatuses for forming thin microelectronic dies.

BACKGROUND

Existing microelectronic device packages typically include a microelectronic die attached to a support member, such as a printed circuit board. Bond pads or other terminals on the die are electrically connected to corresponding terminals on the support member, for example, with solder balls or wires. The connection between the die and the support member can be protected by encapsulating the die, forming a device package. The package can then be electrically connected to other microelectronic devices or circuits, for example, in a consumer or industrial electronic product such as a computer.

Electronic product manufacturers are under continual pressure from end users to reduce the size of the products they make. Accordingly, microelectronic die manufacturers are under pressure to reduce the size of the packaged dies incorporated into the electronic products. One approach to reducing the size of the packaged dies is to reduce the thickness of the dies themselves, for example, by grinding the backside of the wafer from which the die is singulated or diced. One drawback with this approach is that the thin wafer is extremely fragile and is therefore difficult to handle without damaging or breaking it. One approach for addressing this drawback is to attach a relatively thick wafer support to the wafer during the grinding process. The wafer support is then removed after grinding, for example, by heating the bond between the wafer and the wafer support, or by dissolving the bond with an acid. The resulting thin wafer is then attached to a dicing frame with an adhesive. The wafer is singulated or diced into individual dies while it is attached to the dicing frame. After the dicing operation, the adhesive is exposed to ultraviolet radiation which reduces its adhesive strength and allows the dies to be removed from the frame and packaged.

One drawback with the foregoing approach is that the wafer support is removed prior to dicing the wafer. Accordingly, the wafer can be vulnerable to damage and/or breakage until it is supported by the dicing frame. A further drawback of the foregoing approach is that the individual dies may be subject to damage and/or breakage from the time they are removed from the dicing frame to the time they are encapsulated. Accordingly, the foregoing process can be inefficient and expensive because it can damage individual dies and/or entire wafers, which must then be replaced.

SUMMARY

The present invention is directed toward methods and apparatuses for forming thin microelectronic dies. A method in accordance with one aspect of the invention includes releasably attaching a microelectronic substrate to a support member with an attachment device. The microelectronic substrate can have a first surface, a second surface facing opposite from the first surface, and a first thickness between the first and second surfaces. The attachment device can have a releasable bond with the microelectronic substrate, the releasable bond having a bond strength that is reduced upon exposure to at least one energy. The support member can be at least partially transmissive to the at least one energy. The method can further include reducing a thickness of the microelectronic substrate from the first thickness to a second thickness while the microelectronic substrate is releasably attached to the support member. A quantity of the at least one energy can be directed through the support member to the attachment device to reduce the strength of the bond between the attachment device and the microelectronic substrate. At least a portion of the microelectronic substrate can be separated from the support member.

A method in accordance with another aspect of the invention includes attaching the first surface of the microelectronic substrate to a generally rigid support member, wherein the microelectronic substrate includes first and second microelectronic dies each having at least one circuit element at least proximate to the first surface. The method can further include separating a first portion of the support member adjacent to the first microelectronic die from a second portion of the support member adjacent to the second microelectronic die while the first microelectronic die is releasably attached to the first portion of the support member and the second microelectronic die is releasably attached to the second portion of the support member. The first and second microelectronic dies can be separated from each other while the first microelectronic die is releasably attached to the first portion of the support member and the second microelectronic die is releasably attached to the second portion of the support member. The first microelectronic die can then be separated from the first portion of the support member and the second microelectronic die can be separated from the second portion of the support member.

A method in accordance with still another aspect of the invention includes attaching the first surface of the microelectronic substrate to a generally rigid support member, separating the first microelectronic die and a corresponding first portion of the support member from the second microelectronic die and a corresponding second portion of the support member, and adhesively attaching the first microelectronic die and the first portion of the support member as a unit to a die attach member. The method can further include solidifying a bond between the first microelectronic die and the die attach member while simultaneously reducing the strength of a bond between the first microelectronic die and the first portion of the support member. The first portion of the support member can be separated from the first microelectronic die and the first microelectronic die can be electrically coupled to the die attach member.

The invention is also directed to a microelectronic assembly. In one aspect of the invention, the microelectronic assembly includes a microelectronic substrate having a first surface and a second surface facing opposite from the first surface. The microelectronic substrate can further include a first die and a second die, with each of the first and second dies having at least one circuit element positioned at least proximate to the first surface of the substrate. A first processing support member is positioned proximate to the first surface of the microelectronic substrate and is at least partially transmissive to at least one energy. A first attachment device is disposed between the microelectronic substrate and the first processing support member and includes an adhesive bonded to the support member with the adhesive having a reduced adhesiveness upon exposure to the at least one energy. A second processing support member can be positioned proximate to the second surface of the microelectronic substrate, and a second attachment device can be releasably disposed between the microelectronic substrate and the second processing support member.

DETAILED DESCRIPTION

The present disclosure describes microelectronic substrates, corresponding packages and methods for processing the microelectronic substrates and packages. The term "microelectronic substrate" is used throughout to include substrates upon which and/or in which microelectronic circuits or components, data storage elements or layers, and/or vias or conductive line are or can be fabricated. Many specific details of certain embodiments of the invention are set forth in the following description and in FIGS. 1A–2D to provide a thorough understanding of these embodiments. One skilled in the art, however, will understand that the present invention may have additional embodiments, and that the invention may be practiced without several of the details described below.

Figure 1A:
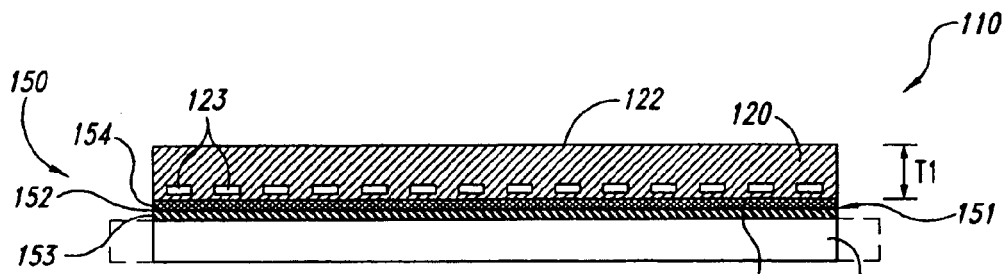
FIGS. 1A–1F schematically illustrate a process for thinning and dicing a microelectronic substrate in accordance with an embodiment of the invention.

FIGS. 1A–1F are partially schematic illustrations of an apparatus and process for reducing the thickness of microelectronic dies in accordance with an embodiment of the invention. Referring first to FIG. 1A, a microelectronic substrate 120 can be attached to a first processing support member 130 with a first attachment device 150 to form a microelectronic assembly 110. In one embodiment, the microelectronic substrate 120 can include a semiconductor wafer and in other embodiments, the microelectronic substrate 120 can include other substrate structures. In any of these embodiments, the microelectronic substrate 120 can have a first surface 121, a second surface 122 facing opposite from the first surface 121, and an initial thickness T1 between the first surface 121 and the second surface 122. The microelectronic substrate 120 can include a plurality of circuit devices or elements 123 (shown schematically in the Figures) positioned at least proximate to the first surface 121. The circuit elements 123 can include lines, vias, terminals, transistors, data storage elements, or other conductor or semiconductor components. The circuit elements 123 can be formed in and/or on the microelectronic substrate 120 using existing techniques, including but not limited to selective deposition, etching, damascene and dual damascene techniques.

In one embodiment, the microelectronic substrate 120 can be positioned relative to the first processing support member 130 such that the first surface 121 faces toward the first processing support member 130. Accordingly, the first attachment device 150 can be positioned between the first processing support member 130 and the first surface 121 of the microelectronic substrate 120 to releasably attach the microelectronic substrate 120 to the first processing support member 130. In one embodiment, the first attachment device 150 can include an adhesive layer 151 disposed on the first processing support member 130. In a particular aspect of this embodiment, the adhesive layer 151 can include a generally planar carrier 152, a first adhesive 153 facing toward the first processing support member 130, and a second adhesive 154 facing toward the microelectronic substrate 120. The first adhesive 153 can connect the first attachment device 150 to the first processing support member 130, and the second adhesive 154 can releasably connect the first attachment device 150 to the microelectronic substrate 120. In other embodiments, the first attachment device 150 can include other arrangements for coupling the microelectronic substrate 120 to the first processing support member 130.

The first processing support member 130 can be sized and shaped to receive the microelectronic substrate 120 and provide support to the microelectronic substrate 120 during subsequent processing steps. In one embodiment, the first processing support member 130 can be generally rigid and can have a planform shape at least approximately identical to that of the microelectronic substrate 120. In another embodiment, the first processing support member 130 can be slightly larger than the microelectronic substrate 120 (as indicated in dashed lines in FIG. 1A) to avoid the need for precisely aligning the microelectronic substrate 120 with the first processing support member 130 when attaching the two together.

In any of the foregoing embodiments, characteristics of the first processing support member 130 can be tailored to and/or selected based on the characteristics of the second adhesive 154. For example, the second adhesive 154 can have properties that change when the second adhesive 154 is exposed to one or more selected energies. In one particular embodiment, the second adhesive 154 can have a first level of adhesiveness (e.g., tackiness or stickiness) prior to being exposed to a selected energy, and can have a second, lower level of adhesiveness after being exposed to the selected energy. In a particular aspect of this embodiment, the second adhesive 154 can have a lower level of adhesiveness when exposed to ultraviolet radiation. For example, the second adhesive can include an acrylic material. In particular embodiments, the second adhesive 154 can include Lintec D175 available from Lintec Corp. of Tokyo, Japan or UC-353ET-110 or UC-337ET-90, both available from Furukawa Electric of Tokyo, Japan. In other embodiments, the adhesive properties of the second adhesive 154 can change upon exposure to other energies, for example, heat energy. Further aspects of an embodiment for which the second adhesive 154 changes adhesive qualities upon exposure to heat energy are described below with reference to FIGS. 2B–2C.

In one embodiment, the first processing support member 130 can be at least partially transmissive to the energy that reduces the adhesiveness of the second adhesive 154. For example, when the second adhesive 154 is sensitive to ultraviolet radiation, the first processing support member 130 can include quartz, glass, or another material that is at least partially transmissive to ultraviolet radiation. In other embodiments, the second adhesive 154 and the first processing support member 130 can have other characteristics that allow the first processing support member 130 to (a) support the microelectronic substrate 120 and (b) transmit a sufficient quantity of the type or types of energy that alter characteristics of the second adhesive 154.

Figure 1B:
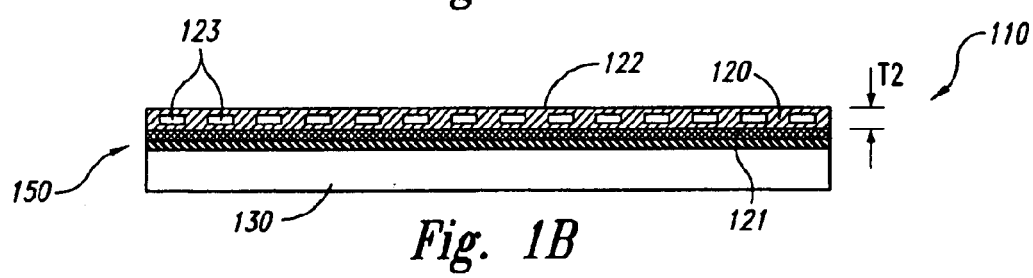

After the microelectronic substrate 120 has been attached to the first processing support member 130, it is ready for additional processing. In one embodiment, the additional processing can include removing material from the second surface 122 of the microelectronic substrate 120 to reduce its thickness. Accordingly, the microelectronic substrate 120 can have a reduced thickness T2 after processing, as shown in FIG. 1B. In one embodiment, the material can be removed from the second surface 122 by grinding and/or etching. In other embodiments, the material can be removed from the second surface 122 in accordance with other existing processes. In any of these embodiments, the first processing support member 130 can provide sufficient support to the microelectronic substrate 120 to prevent it from breaking and/or excessively warping. In one aspect of these embodiments, the thickness of the microelectronic assembly 110 after it has been thinned may be slightly greater than that of a conventional microelectronic substrate, but otherwise the overall size and shape of the microelectronic assembly 110 can be generally the same as the size and shape of conventional microelectronic substrates 120. Accordingly, the equipment and steps used to process the microelectronic substrate 120 with the first processing support member 130 attached can be similar or identical to the equipment and steps used to process existing microelectronic substrates 120.

Figure 1C:
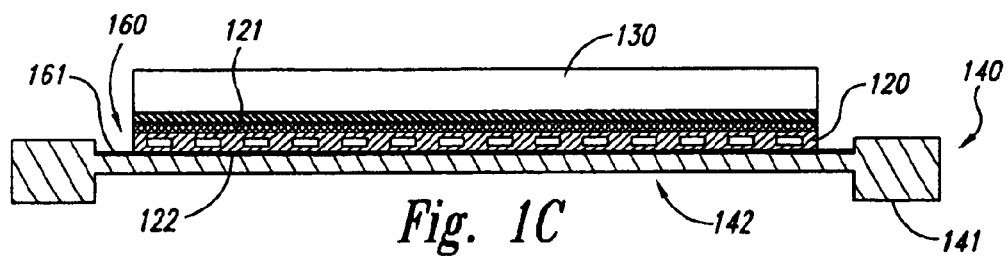
Figure 1D:
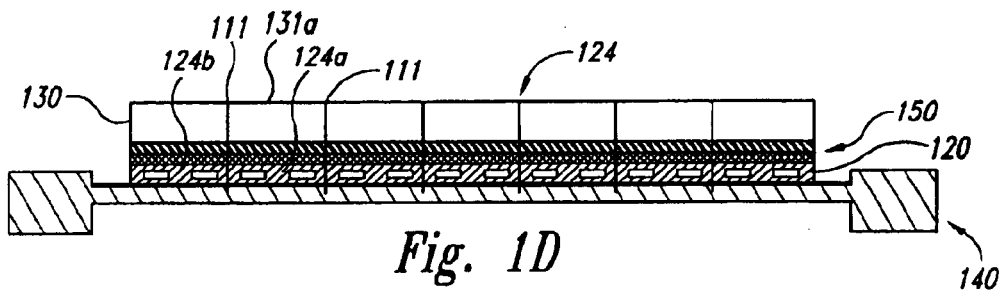
Figure 1E:
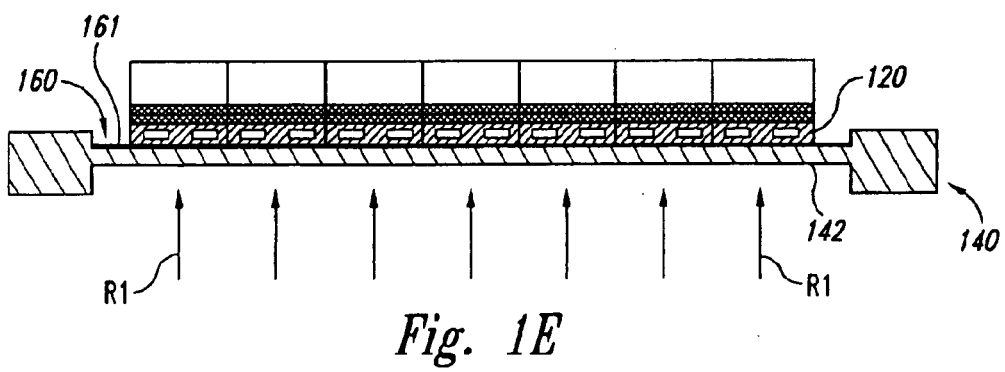

As shown in FIG. 1C, the microelectronic substrate 120 and the first processing support member 130 can next be inverted and attached as a unit to a second processing support member 140. In one aspect of this embodiment, the second processing support member 140 can include an existing dicing support having a frame 141 carrying a replaceable film 142. The film 142 can support a second attachment device 160 which, in one embodiment, includes a third adhesive 161 that releasably adheres to the second surface 122 of the microelectronic substrate 120. Accordingly, the second processing support member 140 can support the second surface 122 of the microelectronic substrate 120, while the first processing support member 130 continues to provide support for the first surface 121.

In the next process step (shown in FIG. 1D), the microelectronic substrate 120 can be diced, singulated, or otherwise separated to produce a plurality of microelectronic dies 124, including a first die 124a and a second die 124b, separated by incisions 111. In one embodiment, a mechanical cutting wheel can be used to form the incisions 111, and in other embodiments, other techniques, including laser cutting techniques can be used to create the division between the first die 124a and the second die 124b. In any of these embodiments, the incision 111 can extend through the first processing support member 130, through the first attachment device 150, through the microelectronic substrate 120, and into the second processing support member 140.

In the next process step (shown in FIG. 1E), the second attachment device 160 located between the second support member 140 and the microelectronic substrate 120 is released. In one aspect of this embodiment, the second attachment device 160 can include a radiation-sensitive third adhesive 161, which has a reduced adhesiveness when exposed to a first radiation R1 represented schematically by arrows in FIG. 1E. Accordingly, in a further aspect of this embodiment, the third adhesive 161 can have properties generally similar to those of the second adhesive 154, while in other embodiments, the third adhesive 161 can have different characteristics. The film 142 on which the third adhesive 161 is disposed can be at least partially transmissive to the first radiation R1. As the third adhesive 161 is irradiated through the film 142, its adhesiveness lessens, allowing the microelectronic dies 124 to be removed from the second support member 140, as described below with reference to FIG. 1F.

Figure 1F:
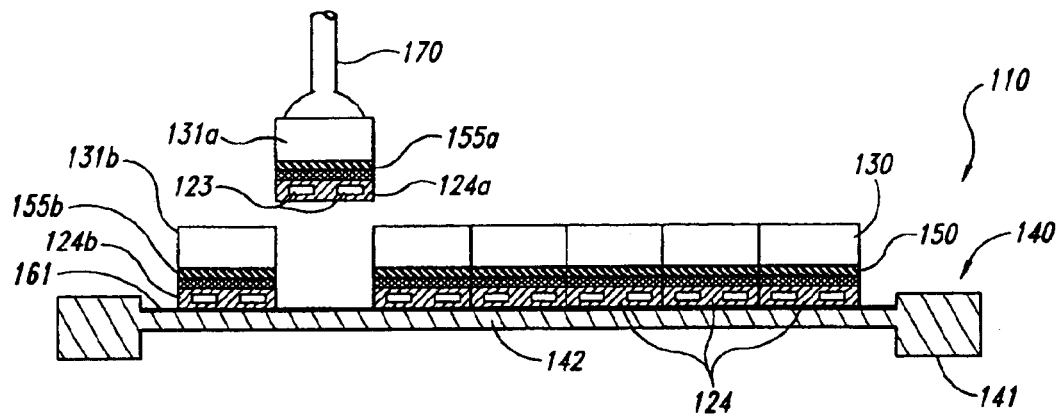

Referring now to FIG. 1F, a conventional pick-and-place apparatus 170 can be used to remove the first die 124a, a first portion 155a of the first attachment device 150, and a first portion 131a of the first processing support member 130 (as a unit) from the remainder of the microelectronic assembly 110. In one aspect of this embodiment, the third adhesive 161 itself remains attached to the film 142 so as not to be removed with the first die 124a. In another embodiment, the third adhesive 161 can be removed along with the first die 124a and can later be removed from the first die 124a in a separate step. In either embodiment, the first die 124a, the first portion 155a of the first attachment device 150, and the first portion 131a of the first processing support member 130 can be removed while the second die 124b, a second portion 155b of the first attachment device 150, and a second portion 131b of the first processing support member 130 remain proximate to the second processing support member 140. The foregoing removal process can then be repeated for the second die 124b and other dies 124.

Figure 2A:
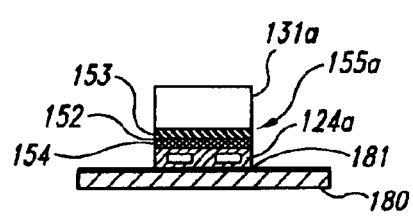
FIGS. 2A–2D illustrate a process for packaging a microelectronic die in accordance with an embodiment of the invention.

After the first die 124a has been separated from the microelectronic substrate 120, it can be packaged. One process for packaging the first die 124a is described below with reference to FIGS. 2A–2D. Referring first to FIG. 2A, the first die 124a (together with the first portions 155a and 131a) can be attached, as a unit, to a die attach member 180. In one embodiment, the die attach member 180 can include a printed circuit board, and in other embodiments, the die attach member 180 can include other suitable substrates. In any of these embodiments, the first die 124a can be attached to the die attach member 180 with a die attach adhesive 181 disposed at an interface between these two components.

Figure 2B:
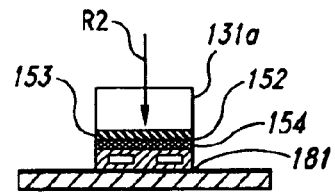
Figure 2C:
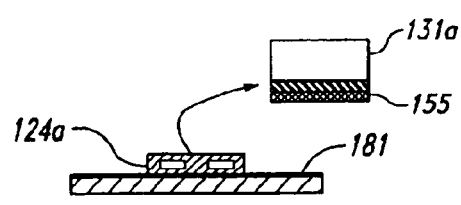

Referring now to FIG. 2B, the first portion 155a of first attachment device 150 (FIG. 1F) can be released to allow the first portion 131a of the first processing support member 130 to be removed from the first die 124a. For example, in one embodiment, a second radiation R2 can be directed through the first portion 131a to reduce the adhesiveness of the second adhesive 154. In one particular embodiment, the second radiation R2 can include ultraviolet radiation, for example, having a wavelength in the range of from about 220 nm to about 365 nm. In another embodiment, the second radiation R2 can have a different wavelength. In still another embodiment, another energy (for example, heat energy) can be used to reduce the adhesiveness of the second adhesive 154. In either embodiment, after sufficient exposure to the selected energy, the first portion 131a of the first processing support member 130 and the first portion 155a of the first attachment device 150 can be removed as a unit from the first die 124a, as shown in FIG. 2C.

In one embodiment, the energy used to reduce the strength of the bond between the first die 124a and the first attachment device 150 can simultaneously increase the strength of the bond between the die attach adhesive 181 and the first die 124a. For example, in one embodiment, the second adhesive 154 can be selected to decrease in adhesiveness when exposed to heat at a selected temperature, and the die attach adhesive 181 can be selected to increase in adhesiveness at the same temperature. In a particular embodiment, the second adhesive 154 can be selected to include Revalpha #3195MS heat release tape (which decreases its bond strength at a temperature of from about 90° C. to about 150° C. and which is available from Nitto Denko of Osaka, Japan) and the die attach adhesive 181 can be selected to include QMI536 (which increases its bond strength over the same temperature range and which is available from Dexter/Loctite of Rocky Hill, Conn.). In other embodiments, the second adhesive 154 and the die attach adhesive 181 can include other substances having adhesive characteristics that behave in opposite manners when exposed to the same energy.

Figure 2D:
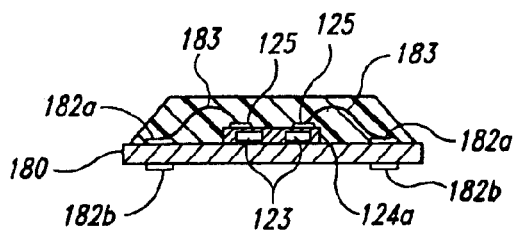

In subsequent process steps, the first die 124a can be electrically coupled to the die attach member 180. For example, as shown in FIG. 2D, the first die 124a can include die bond pads 125 which can be electrically coupled to first attach member bond pads 182a. In one embodiment, the attachment between these two components can be made with wire bonds 183, and in other embodiments, other conductive links (including solder balls), can be used to connect the die bond pads 125 with the corresponding first attach member bond pads 182a. In any of these embodiments, the die attach member 180 can further include second attach member bond pads 182b which are electrically coupled to the first attach member bond pads 182a via circuitry internal to the die attach member 180. The second attach member bond pads 182b can be electrically coupled to other microelectronic devices via solder balls or other conductive structures to provide electrical signals to and from the first die 124a. An encapsulant 183 can optionally be disposed over the wire bonds 183 and the first die 124a to protect these components.

One feature of an embodiment of the apparatus and process described above with reference to FIGS. 1A–2D is that the first processing support member 130 can remain attached to the microelectronic substrate 120 as the microelectronic substrate 120 is thinned and attached to the second processing support member 140. An advantage of this feature is that the microelectronic substrate 120 can be less likely to be damaged or broken as it is transferred from a grinder or other thickness-reducing tool to the second processing support member 140.

Another feature of an embodiment of the process described above with reference to FIGS. 1A–2D is that the first portion 131a of the first processing support member 130 can remain attached to the first die 124a as the first die 124a is moved from the second processing support member 140 to the die attach member 180. After the first die 124a is secured to the die attach member 180, the first portion 131a of the first processing support member 130 is removed. An advantage of this arrangement is that the first die 124a is less likely to be damaged as it is moved from the second processing support member 140 to the die attach member 180 because the first portion 131a of the first processing support member 130 provides support and protection. For example, the first portion 131a can shield the first surface 121 and the proximate circuit elements 123 from incidental contact with surrounding tools, machinery and/or other components. The first portion 131a can also provide a generally rigid support structure that reduces the likelihood for the first die 124a to bend as it is moved.

From the foregoing, it will be appreciated that specific embodiments of the invention have been described herein for purposes of illustration, but that various modifications may be made without deviating from the spirit and scope of the invention. For example, in other embodiments, the second adhesive 154 and/or the third adhesive 161 can be made less adhesive by exposure to energies other than ultraviolet radiation. Such energies can include electromagnetic radiation having frequencies other than ultraviolet frequencies, or other types of energy, such as heat energy. Accordingly, the invention is not limited except as by the appended claims.

What is claimed is:

1. A microelectronic assembly, comprising:
   a microelectronic substrate having a first surface and a second surface facing opposite from the first surface, the microelectronic substrate having a first die and a second die, with each of the first and second dies having at least one circuit element positioned at least proximate to the first surface;
   a first processing support member positioned proximate to the first surface of the microelectronic substrate, the first processing support member being generally rigid and at least partially transmissive to at least one energy;
   a first attachment device disposed between the microelectronic substrate and the first processing support member, the first attachment device including an adhesive bonded to the first processing support member, the adhesive having a reduced adhesiveness upon exposure to the at least one energy;
   a second processing support member positioned proximate to the second surface of the microelectronic substrate; and
   a second attachment device releasably disposed between the microelectronic substrate and the second processing support member.

2. The microelectronic assembly of claim 1 wherein the first processing support member is at least partially transmissive to ultraviolet radiation.

3. The microelectronic assembly of claim 1 wherein the first processing support member includes quartz.

4. The microelectronic assembly of claim 1 wherein the first processing support member includes glass.

5. The microelectronic assembly of claim 1 wherein the adhesive has a reduced adhesiveness upon exposure to ultraviolet radiation, and wherein the first processing support member is at least partially transmissive to ultraviolet radiation.

6. The microelectronic assembly of claim 1 wherein the second processing support member includes a dicing frame.

7. The microelectronic assembly of claim 1 wherein the at least one energy includes a first energy and wherein the second processing support member is at least partially transmissive to a second energy.

8. The microelectronic substrate of claim 1 wherein the adhesive is a first adhesive and wherein the second attachment device includes a second adhesive.

9. The microelectronic substrate of claim 1 wherein the adhesive is a first adhesive and wherein the second attachment device includes a second adhesive, further wherein a composition of the first adhesive is at least approximately the same as a composition of the second adhesive.

10. The microelectronic assembly of claim 1 wherein the adhesive has a reduced adhesiveness upon exposure to ultraviolet radiation having a wavelength of from about 220 nm to about 365 nm, and wherein the first processing support member is at least partially transmissive to ultraviolet radiation.

11. The microelectronic substrate of claim 1 wherein the adhesive is a first adhesive and wherein the second attachment device includes a second adhesive that includes an acrylic.

12. The microelectronic substrate of claim 1 wherein the substrate has a first footprint and the first processing support member has a second footprint at least approximately the same as or larger than the first footprint.

* * * * *